United States Patent
Zhou

(10) Patent No.: US 10,879,924 B2
(45) Date of Patent: Dec. 29, 2020

(54) DELTA-SIGMA MODULATOR AND ASSOCIATED SIGNAL PROCESSING METHOD

(71) Applicant: Realtek Semiconductor Corp., HsinChu (TW)

(72) Inventor: Xiaobo Zhou, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/525,620

(22) Filed: Jul. 30, 2019

(65) Prior Publication Data

US 2020/0153451 A1  May 14, 2020

(30) Foreign Application Priority Data

Nov. 9, 2018 (CN) .......................... 2018 1 1331161

(51) Int. Cl.
*H03M 3/00* (2006.01)
(52) U.S. Cl.
CPC ........... *H03M 3/422* (2013.01); *H03M 3/436* (2013.01)
(58) Field of Classification Search
CPC ....... H03M 3/422; H03M 3/436; H03M 3/434
USPC ................................ 341/155, 143, 144, 122
See application file for complete search history.

(56) References Cited

U.S. PATENT DOCUMENTS

| | | | | |
|---|---|---|---|---|
| 2012/0007643 A1* | 1/2012 | Jian | ....................... | H03L 7/1976 327/157 |
| 2013/0187803 A1* | 7/2013 | Kaald | ..................... | H03M 3/37 341/143 |
| 2018/0159550 A1 | 6/2018 | Zhou | | |
| 2019/0158111 A1* | 5/2019 | Hsieh | ..................... | H03M 3/428 |
| 2019/0379391 A1* | 12/2019 | Miglani | ................... | H03M 3/42 |

OTHER PUBLICATIONS

Shouli Yan, "A Continuous-Time Sigma-Delta Modulator With 88-dB Dynamic Range and 1.1-MHz Signal Bandwidth", IEEE Journal of Solid-State Circuits, vol. 39, No. 1, Jan. 2004.
Gerhard Mitteregger, "A 20-mW 640-MHz CMOS Continuous-Time Sigma-Delta ADC With 20-MHz Signal Bandwidth, 80-dB Dynamic Range and 12-bit ENOB", IEEE Journal of Solid-State Circuits, vol. 41, No. 12, Dec. 2006.
Yun-Shiang Shu, "A 28fJ/conv-step CT Delta-Sigma Modulator with 78dB DR and 18MHz BW in 28nm CMOS Using a Highly Digital Multibit Quantizer", 2013 IEEE International Solid-State Circuits Conference.

(Continued)

*Primary Examiner* — Peguy Jean Pierre
(74) *Attorney, Agent, or Firm* — Winston Hsu

(57) ABSTRACT

The present invention provides a delta-sigma modulator and associated signal processing method, wherein the signal processing method includes: generating a first difference signal according to a difference between an input signal and a first feedback signal; filtering the first difference signal to generate a filtered signal; generating a second difference signal according to a difference between the filtered signal and a second feedback signal; quantizing the second difference signal to generate an output signal; using a first DAC to generate the first feedback signal according to the output signal; using a second DAC to generate a first analog signal according to the output signal; delaying the output signal to generate a first delayed output signal; using a third DAC to generate a second analog signal according to the first delayed output signal; and generating the second feedback signal according to the first analog signal and the second analog signal.

6 Claims, 3 Drawing Sheets

(56) References Cited

OTHER PUBLICATIONS

Maurits Ortmanns, "Compensation of Finite Gain-Bandwidth Induced Errors in Continuous-Time Sigma-Delta Modulators", IEEE Transactions on Circuits and Systems-I: Regular Papers, vol. 51, No. 6, Jun. 2004.

Shanthi Pavan, "Systematic Design Centering of Continuous Time Oversampling Converters", IEEE Transactions on Circuits and Systems-II: Express Briefs, vol. 57, No. 3, Mar. 2010.

\* cited by examiner

DELTA-SIGMA MODULATOR AND ASSOCIATED SIGNAL PROCESSING METHOD

BACKGROUND OF THE INVENTION

1. Field of the Invention

The present invention relates to a delta-sigma modulator.

2. Description of the Prior Art

In a delta-sigma modulator, the number of integrators that an output signal of a quantizer passes though can be regarded as an order of the path. For example, the output signal returns to the quantizer without passing through any integrator is a zero-order path, the output signal goes back to the quantizer via one integrator within a loop filter is a first-order path, and the output signal goes back to the quantizer via two integrators within the loop filter is a second-order path, and so on. In the operation of the delta-sigma modulator, the first-order path is the main factor determining the bandwidth, so the integrator on the first-order path requires faster speed and higher gain, and the first-order path determines the complexity of the loop filter design.

SUMMARY OF THE INVENTION

It is therefore an objective of the present invention to provide a delta-sigma modulator, which can lower the gain of the integrator of the first-order path in a high-speed application by adding digital-to-analog converters (DAC) on the zero-order path and setting the appropriate delay times of the overall structure and sampling times, to reduce the complexity of the loop filter design.

According to one embodiment of the present invention, a delta-sigma module is disclosed, wherein the delta-sigma modulator comprises a receiving circuit, a loop filter, a subtraction circuit, a quantizer, a first DAC, a second DAC, a first delay circuit, and a third DAC. In the operations of the delta-sigma modulator, the receiving circuit is configured to generate a first difference signal according to a difference between an input signal and a first feedback signal. The loop filter is configured to filter the first difference signal to generate a filtered signal. The subtraction circuit is configured to generate a second difference signal according to a difference between the filtered signal and a second feedback signal. The quantizer is configured to quantize the second difference signal to generate an output signal. The first DAC is configured to generate the first feedback signal according to the output signal. The second DAC is configured to generate a first analog signal according to the output signal. The first delay circuit is configured to delay the output signal to generate a first delayed output signal. The third DAC is configured to generate a second analog signal according to the first delayed output signal, wherein the second feedback signal is generated according to the first analog signal and the second analog signal.

In another embodiment of the present invention, a signal processing method is disclosed. The signal processing method comprises the steps of: generating a first difference signal according to a difference between an input signal and a first feedback signal; filtering the first difference signal to generate a filtered signal; generating a second difference signal according to a difference between the filtered signal and a second feedback signal; using a first DAC to generate the first feedback signal according to the output signal; using a second DAC to generate a first analog signal according to the output signal; delaying the output signal to generate a first delayed output signal; using a third DAC to generate a second analog signal according to the first delayed output signal; and generating the second feedback signal according to the first analog signal and the second analog signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
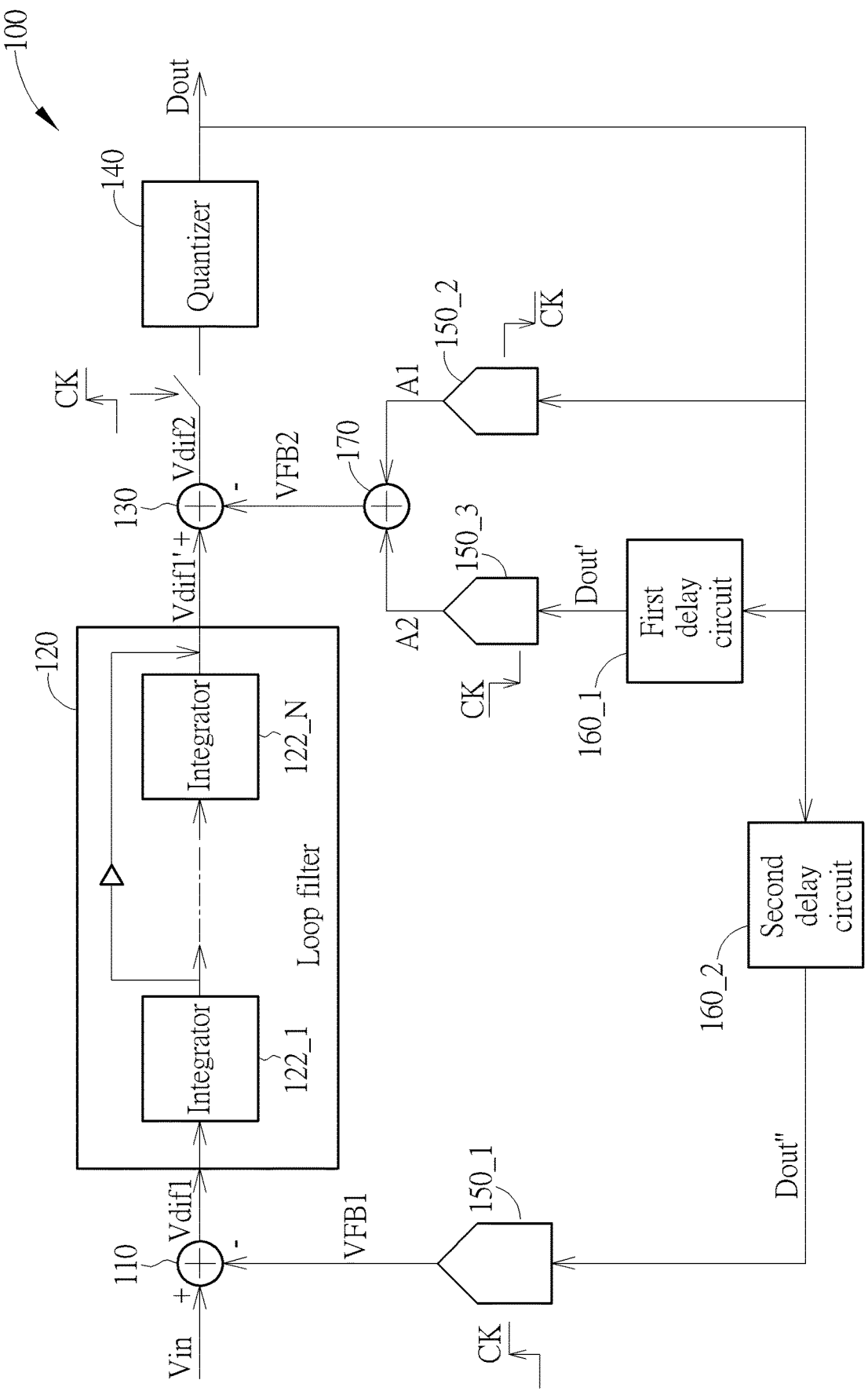
FIG. 1 is a diagram illustrating a delta-sigma modulator according to one embodiment of the present invention.

FIG. 1 is a diagram illustrating a delta-sigma modulator 100 according to one embodiment of the present invention. As shown in FIG. 1, the delta-sigma modulator 100 is a continuous-time delta-sigma modulator, and the delta-sigma modulator 100 comprises a receiving circuit 110, a loop filter 120, a subtraction circuit 130, a quantizer 140, a first DAC 150_1, a second DAC 150_2, a third DAC 150_3, a first delay circuit 160_1, a second delay circuit 160_2 and a summation circuit 170, wherein the loop filter 120 comprises a plurality of integrators 122_1-122_N.

In the operations of the delta-sigma modulator 110, the receiving circuit 110 serves as a subtraction circuit, and the receiving circuit receives an input signal Vin and a first feedback signal VFB1, and generates a first difference signal Vdif1 according to a difference between the input signal Vin and the first feedback signal VFB1. Then, the loop filter 120 filters the first difference signal Vdif1 to generate a filtered signal Vdif1', the subtraction circuit 130 generates a second difference signal Vdif2 according to the filtered signal Vdif1' and a second feedback signal VFB2, and the quantizer 140 quantizes the second difference signal Vdif2 to generate an output signal Dout. In the operations of the feedback paths, the second delay circuit 160_2 delays the output signal Dout to generate a second delayed output signal Dout", and the first DAC 150_1 performs the digital-to-analog converting operations upon the second delayed output signal Dout" to generate the first feedback signal VFB1. In addition, the second DAC 150_2 performs the digital-to-analog converting operations upon the output signal Dout to generate a first analog signal A1, the first delay circuit 160_1 delays the output signal Dout to generate a first delayed output signal Dout', the third DAC 150_3 performs the digital-to-analog converting operations upon the first delayed output signal Dout' to generate a second analog signal A2, and the summation circuit 170 combines the first analog signal A1 and the second analog signal A2 to generate the second feedback signal VFB2.

In this embodiment, to make sure that the quantizer 140, the first DAC 150_1, the second DAC 150_2, the third DAC 150_3, the first delay circuit 160_1, the second delay circuit 160_2 and the summation circuit 170 have enough working times in a high-speed application, the quantizer 140 and the first DAC 150_1 are controlled to sample the signals simultaneously. For example, the quantizer 140 and the first DAC 150_1 can sample the signals at a rising edge or a falling edge of a clock signal CK used by the delta-sigma modulator 100, to make the above-mentioned digital circuits has a longer working time (i.e. a period of the clock signal CK). In the embodiment shown in FIG. 1, the quantizer 140 and the first DAC 150_1 sample the signals at the rising edge of the clock signal CK, wherein a switch in front of the quantizer 140 is used to indicate that the quantizer 140 starts to receive the second difference signal Vdif2 at the rising edge of the clock signal CK, to quantize the second difference signal Vdif2 to generate the output signal Dout.

In this embodiment, the second DAC 150_2 and the third DAC 150_3 are controlled to sample the signals at the falling edge of the clock signal CK, to generate the first analog signal A1 and the second analog signal A2, respectively.

As described in the prior art, the first-order path of the delta-sigma modulator 100 is the main factor determining the bandwidth, so the integrator on the first-order path needs faster speed and higher gain, causing higher design complexity of the loop filter 120. In the embodiment, because the delta-sigma modulator 100 positions a plurality of DACs on the zero-order path (i.e. the second DAC 150_2 and the third DAC 150_3) and the designs of the delay circuits, the integrator 122_1 on the first-order path does not need to have too high gain, and the design complexity of the loop filter 120 is reduced. Specifically, the delay amount the first delay circuit 160_1 may be one cycle of the clock signal CK (i.e. expressed by "$z^{-1}$" by Z transform), and the delay amount the second delay circuit 160_2 may also be one cycle of the clock signal CK (i.e. "$z^{-1}$"), and there is no need to intentionally position any delay circuit between the second DAC 150_2 and the output signal Dout. The above designs allow the delta-sigma modulator 100 to provide more high-frequency information in the zero-order path, so the integrator 122_1 of the loop filter 120 does not need high gain characteristics, thereby reducing design complexity and saving power.

Figure 2:
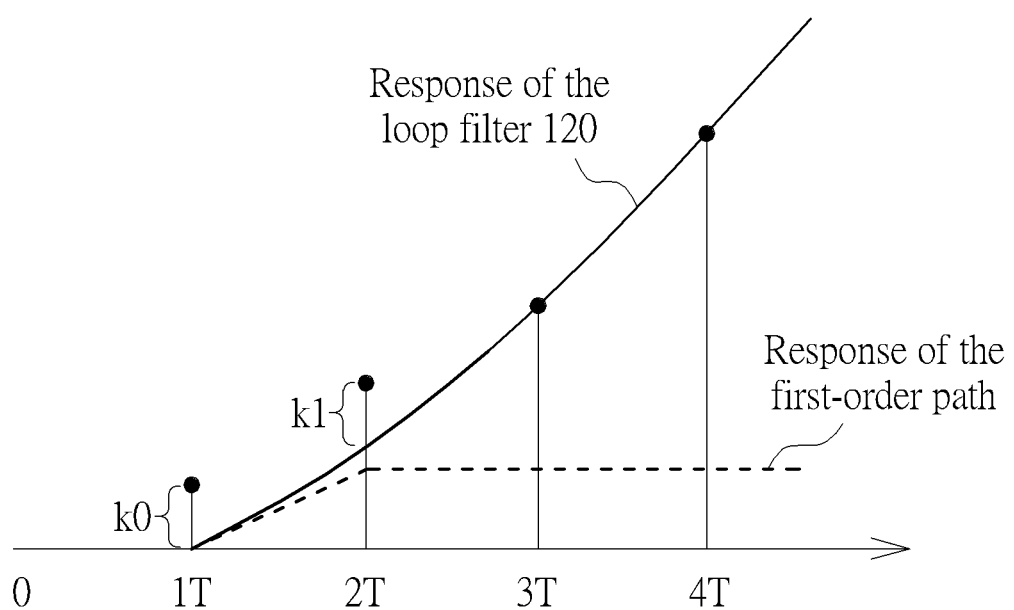
FIG. 2 shows an open loop impulse response of the signal delta modulator.

FIG. 2 shows an open loop impulse response of the signal delta modulator 100, wherein the impulse response is measured by opening the modulator's loop at the output of the quantizer 140 and applying a pulse to input terminals of the second DAC 150_2, the first delay circuit 160_1 and the second delay circuit 160_2; and at this time the signal received by the quantizer 140 (i.e. the second difference signal Vdif2) is the open loop impulse response. In FIG. 2, the interval between 1T, 2T, 3T is a cycle/period of the clock signal CK, 'k0' is the response provided by the second DAC 150_2, 'k1' is the response provided by the second DAC 150_3. Therefore, since the third DAC 150_3 provides 'k1', the response (gain) of the first-order path can achieve the overall requirement of the delta-sigma modulator 100 without being designed too high.

It is noted that the delta-sigma modulator 100 includes only two DACs on the zero-order path, and these designs are for illustrative purposes only. In other embodiments of the present invention, the zero-order path can include three or more DACs. These alternative designs shall fall within the scope of the present invention.

Figure 3:
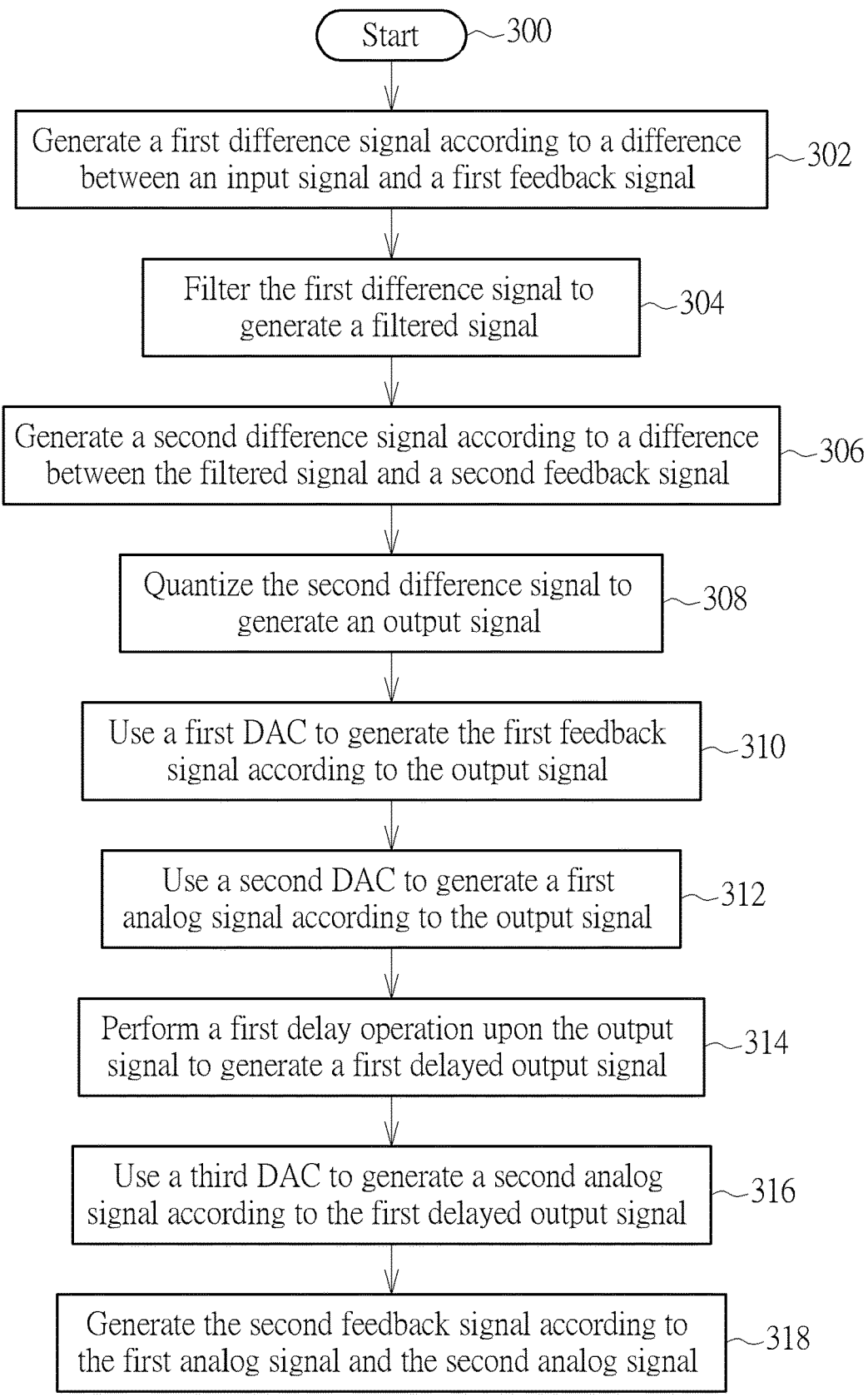
FIG. 3 is a flowchart of a signal processing method according to one embodiment of the present invention.

FIG. 3 is a flowchart of a signal processing method according to one embodiment of the present invention. Refer to the above disclosure, the flow of the signal processing method is described as follows.

Step 300: the flow starts.

Step 302: generate a first difference signal according to a difference between an input signal and a first feedback signal.

Step 304: filter the first difference signal to generate a filtered signal.

Step 306: generate a second difference signal according to a difference between the filtered signal and a second feedback signal.

Step 308: quantize the second difference signal to generate an output signal.

Step 310: use a first DAC to generate the first feedback signal according to the output signal.

Step 312: use a second DAC to generate a first analog signal according to the output signal.

Step 314: perform a first delay operation upon the output signal to generate a first delayed output signal.

Step 316: use a third DAC to generate a second analog signal according to the first delayed output signal.

Step 318: generate the second feedback signal according to the first analog signal and the second analog signal.

Briefly summarized, in the delta-sigma modulator of the present invention, by setting a plurality of DACs and corresponding delay circuits on the zero-order path, the gain requirement of the integrator on the first-order path can be reduced, thereby further reducing the design difficulty and power consumption of the loop filter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A delta-sigma modulator, comprising:
    a receiving circuit, arranged to generate a first difference signal according to a difference between an input signal and a first feedback signal;
    a loop filter, coupled to the receiving circuit, arranged to filter the first difference signal to generate a filtered signal at an output node of the loop filter;
    a subtraction circuit, arranged to generate a second difference signal according to a difference between the filtered signal and a second feedback signal;
    a quantizer, arranged to receive the second difference signal from the subtraction circuit, and quantize the second difference signal to generate an output signal;
    a first digital-to-analog converter (DAC), arranged to generate the first feedback signal according to the output signal;
    a second DAC, arranged to generate a first analog signal according to the output signal;
    a first delay circuit, arranged to delay the output signal to generate a first delayed output signal, wherein a delay amount of the first delay circuit is a cycle of a clock signal;
    a third DAC, arranged to generate a second analog signal according to the first delayed output signal, wherein the second feedback signal is generated according to the first analog signal and the second analog signal; and a second delay circuit, arranged to delay the output signal to generate a second delayed output signal, wherein a delay amount of the second delay circuit is a cycle of the clock signal;

wherein the first DAC generates the first feedback signal according to the second delayed output signal;

wherein the third DAC directly receives the first delayed output signal to generate the second analog signal, the first DAC directly receives the second delayed output signal to generate the first feedback signal; and there is no delay circuit between the output signal and the second DAC, and the second DAC directly receives the output signal to generate the first analog signal.

2. The delta-sigma modulator of claim 1, wherein the quantizer and the first DAC start sampling operations at a rising edge or a falling edge of the clock signal.

3. The delta-sigma modulator of claim 2, wherein the quantizer and the first DAC start the sampling operations at the rising edge of the clock signal, and the second DAC and the third DAC start the sampling operations at the falling edge of the clock signal.

4. A signal processing method, comprising:
generating a first difference signal according to a difference between an input signal and a first feedback signal;
filtering the first difference signal to generate a filtered signal;
generating a second difference signal according to a difference between the filtered signal and a second feedback signal;
using a quantizer to receive the second difference signal and quantize the second difference signal to generate an output signal;
using a first digital-to-analog converter (DAC) to generate the first feedback signal according to the output signal;
using a second DAC to generate a first analog signal according to the output signal;
performing a first delay operation upon the output signal to generate a first delayed output signal, wherein a delay amount of the first delay operation is a cycle of a clock signal;
using a third DAC to generate a second analog signal according to the first delayed output signal;
generating the second feedback signal according to the first analog signal and the second analog signal;
performing a second delay operation upon the output signal to generate a second delayed output signal, wherein a delay amount of the second delay operation is a cycle of the clock signal;
wherein the first DAC generates the first feedback signal according to the second delayed output signal;
wherein the third DAC directly receives the first delayed output signal to generate the second analog signal, the first DAC directly receives the second delayed output signal to generate the first feedback signal; and there is no delay circuit between the output signal and the second DAC, and the second DAC directly receives the output signal to generate the first analog signal.

5. The signal processing method of claim 4, wherein the step of quantizing the second difference signal to generate the output signal and the step of using the first DAC to generate the first feedback signal according to the output signal start at a rising edge or a falling edge of the clock signal.

6. The signal processing method of claim 5, wherein the step of quantizing the second difference signal to generate the output signal and the step of using the first DAC to generate the first feedback signal according to the output signal start at the rising edge of the clock signal, and the step of using the second DAC to generate the first analog signal according to the output signal and the step of using the third DAC to generate the second analog signal according to the first delayed output signal start at the falling edge of the clock signal.

* * * * *